United States Patent [19]

Deak et al.

[11] Patent Number: 5,084,356
[45] Date of Patent: Jan. 28, 1992

[54] FILM COATED WITH GLASS BARRIER LAYER WITH METAL DOPANT

[75] Inventors: Gedeon I. Deak, Wilmington, Del.; Scott C. Jackson, Kennett Square, Pa.

[73] Assignee: E. I. du Pont de Nemours and Company, Wilmington, Del.

[21] Appl. No.: 513,302

[22] Filed: Apr. 20, 1990

[51] Int. Cl.⁵ .............................. B32B 15/08
[52] U.S. Cl. .................... 428/458; 428/412; 428/417; 428/446; 428/474.4; 428/480
[58] Field of Search ............... 428/446, 458, 480, 412, 428/417, 474.4

[56] References Cited

U.S. PATENT DOCUMENTS

| | | |
|---|---|---|
| 3,442,686 | 5/1969 | Jones . |
| 3,522,080 | 7/1970 | Dietzel et al. . |
| 3,808,027 | 4/1974 | Anderson et al. . |
| 4,312,915 | 1/1982 | Fan ............................ 428/469 |
| 4,528,234 | 7/1985 | Kaibo et al. . |
| 4,552,791 | 11/1985 | Hahn . |
| 4,702,963 | 10/1987 | Phillips et al. . |

FOREIGN PATENT DOCUMENTS

| | | |
|---|---|---|
| 61-47244 | 3/1986 | Japan . |
| 60-244540 | 12/1986 | Japan . |
| 62-156943 | 7/1987 | Japan . |
| 62-158677 | 7/1987 | Japan . |
| 2197881 | 6/1988 | United Kingdom . |

OTHER PUBLICATIONS

Chahroudi, "Glassy Barriers from Electron Beam Web Coaters", 5/4/89.
Sakamaki, "Vapor Coating with Silicon Dioxide", 5/23/89.

Primary Examiner—Merrell C. Cashion, Jr.
Assistant Examiner—Hoa T. Le
Attorney, Agent, or Firm—David M. Shold

[57] ABSTRACT

A structure comprising a polymeric film substrate and a glassy coating of silicon dioxide heavily doped with at least one metal selected from the group consisting of antimony, aluminum, chromium, cobalt, copper, indium, iron, lead, manganese, tin, titanium, tungsten, zinc, and zirconium, provides improved barrier properties.

22 Claims, No Drawings

FILM COATED WITH GLASS BARRIER LAYER WITH METAL DOPANT

BACKGROUND OF THE INVENTION

This invention relates to polymeric films having improved barrier properties towards oxygen and other materials.

Flexible polymer films have been used extensively in the packaging of food, electronic and medical products. It is desirable in many applications to have a good barrier to oxygen and/or water vapor. However, most polymer based barrier resins such as ethylene vinyl alcohol copolymer ("EVOH") or polyvinylidene chloride ("PVDC"), although exhibiting good barriers to oxygen or moisture, do so only under ideal conditions. Although EVOH can be an excellent oxygen barrier, it looses its barrier property at moderate to high relative humidity. Thus this material is not widely usable in applications involving high water vapor content, such as moist foods. Although PVDC exhibits good moisture and oxygen barrier properties, it is not suitable for many applications, has an undesirable yellow color, and is difficult if not impossible to recycle. Other proposed alternatives to provide oxygen and water vapor barriers include laminations of aluminum foil and aluminum metallized film. Although these exhibit good barrier properties, they are completely opaque, cannot be recycled, and cannot be readily used for food packaging destined for use in a microwave oven.

U.S. Pat. No. 4,702,963 discloses packaging film in which an adhesion layer is first vacuum deposited on a flexible polymer substrate, followed by vacuum deposition of a barrier layer, to confer retortability to the packaging film. The adhesion layer can consist of Cr, which is preferred, co-deposited mixtures of Cr and SiO having at least 20% by weight Cr, among others. The barrier layer is preferably silicon monoxide or silicon dioxide. When silicon dioxide is used, it may be mixed with glass modifiers such as oxides of Mg, Ba, and Ca, or with fluoride of alkaline earth metals, e.g. $MgF_2$. The glass modifiers serve to alter the color appearance of the overall coating. For example, a chromium/SiO composite film is disclosed to produce a coating with a yellowish appearance, while a neutral gray appearance is disclosed to result from the mixture of $SiO_2$ with glass modifiers.

Japanese patent application 60-244540 discloses a laminate comprising the formation on the surface of a plastic film a transparent thin layer of one or more materials selected from metals, metal oxides, or glass by means of a dry plating method, providing a laminate with good barrier properties. Suitable metals include aluminum, silicon, iron, gold, silver, copper, chromium, nickel, tin, titanium, and magnesium. Suitable oxides may be the oxides of these metals (such as silicon oxide, which can be mixtures of silicon monoxide and silicon dioxide), and glass. A mixed evaporation or multilayer evaporation may be performed.

Japanese patent application 61-47244 discloses a laminate of a plastic film or sheet on the surface of which has been formed a transparent thin layer by dry plating one or more of the materials selected from metals, oxides of the metals, and glass. Suitable metals include aluminum, silicon, titanium, tin, iron, gold, silver, copper, chromium, nickel, magnesium, or the like. The oxides are those of these metals, or glass. These metals and metal oxides may be evaporated in a mixed state to form a layer or evaporated to form a multilayer. The laminate is said to have excellent gas-barrier performance.

U.S. Pat. No. 4,528,234 discloses a transparent laminate comprising a transparent plastic resin film substrate, a thin layer of at least one metal such as aluminum, tin, iron, zinc, or magnesium formed on the substrate by vacuum deposition, and a carboxyl group-containing polyolefin (e.g. ionomer) layer formed on the metal layer by lamination. Optionally an additional layer of silicon oxide or titanium oxide may be present. Oxygen and moisture impermeability are said to be improved.

U.S. Pat. No. 3,442,686 discloses a composite film structure suitable as a packaging film consisting of a flexible transparent organic base sheet, e.g. PET film, having a top coating of a polymer such as polyethylene and an intermediate, gas barrier, glassy coating of an inorganic material such as a silicon oxide. Other inorganic compositions which are useful include lead chloride, silver chloride, calcium silicate, and crushed "Alundum" ($Al_2O_3$ with $SiO_2$ binder).

Japanese patent application 62-158677 discloses a transparent laminate wrapping material where a thin single or mixed metal oxide layer is an intermediate layer in a laminate structure. The laminate is said to have excellent gaseous oxygen and water vapor barrier properties. Silicon oxide and aluminum oxide-silicon oxide mixtures are effective.

Japanese patent application 62-156943 discloses a vapor-deposited layer built-in type multilayered gas-barrier film or sheet having two or more vapor-deposited layers of metals or metal compounds formed at one or more laminate interfaces of a multilayered synthetic resin film or sheet, having good gas barrier characteristics. Suitable metals include aluminum, zinc, copper, platinum, indium, tin, gold, silver, and silicon. A suitable metal compound is silicon oxide.

Chahroudi, "Glassy Barriers from Electron Beam Web Coaters," paper presented at Annual Technical Meeting of Society of Vacuum Coaters, discloses barriers of silicon oxide or $SiO_2$. Oxides of Mg, Ca, Ba, B, Al, In, Ge, Sn, Zn, Ti, Zr, Ce, and $MgF_2$ are disclosed as modifiers or replacements for silica.

Sakamaki, "Vapor Coating with Silicon Dioxide," discloses barrier properties of film with a thin layer of ceramic such as $SiO_x$, in particular silicon oxide.

U.S. Pat. No. 3,522,080 discloses a process for hardening the surface of a synthetic material such as a lacquer film, which includes vapor deposition of layers of silicon oxide ($SiO_x$ derived from $SiO_2$) onto the surface. The silicon oxide can contain 1.5 to 5 percent oxide of chromium, zinc, zirconium, or antimony.

U.K. patent application 2 197 881 discloses a heat resistant vessel made of a thermoplastic polyester resin by forming an inorganic coating layer comprising a silicon compound or a metal oxide-containing silicon compound on a surface of the polyester resin. The inorganic coating layer is obtainable from colloidal polysiloxane compounds. The coating material may further contain additives such as an inorganic filler of e.g. titanium oxide, zirconium silicate, nickel, copper oxide, manganese oxide, alumina, etc.

In certain of the above references, coatings of silicon monoxide (SiO), silicon dioxide ($SiO_2$), or combinations thereof with a variety of metal oxides have been disclosed. There has been lacking, however, teaching as to the type and quantity of metal or metal oxide required to provide coatings of $SiO_2$ with improved barrier properties. It has now been observed that combinations of $SiO_2$ with many metals or metal oxides in fact do not provide improved barrier performance or alternatively reduce the optical transparency of films coated therewith to an objectionable extent. Furthermore, much of the prior art focuses on SiO as the primary barrier layer. The use of SiO is not practical for many packaging applications because it is quite expensive and exhibits an objectionable yellow color. The present invention, in contrast, overcomes these shortcomings by providing an inexpensive inorganic coating with good barrier performance and good light and microwave transparency, suitable for packaging applications.

SUMMARY OF THE INVENTION

The present invention provides a structure having superior barrier properties, comprising a polymeric substrate and a glassy coating of silicon dioxide doped with at least one metal selected from the group consisting of antimony, aluminum, chromium, cobalt, copper, indium, iron, lead, manganese, tin, titanium, tungsten, zinc, and zirconium, said coating and metal dopant contained therein being present in an amount which provides an oxygen transmission value through the coated film structure of at most about 5 mL/day-$m^2$-atm. Preferably the amount of metal dopant is sufficient to provide an oxygen permeation value for the glassy coating of at most about $3000 \times 10^{-6}$ mL-mm/day-$m^2$-atm. The structure may be a film and may comprise one or more layers of a multiple layer structure.

The invention further provides a process for imparting barrier properties to a polymeric substrate, comprising the steps of selecting a polymeric substrate and vacuum depositing onto the substrate a glassy coating prepared from silicon dioxide and at least one metal selected from the group consisting of antimony, aluminum, chromium, cobalt, copper, indium, iron, lead, manganese, tin, titanium, tungsten, zinc, and zirconium, wherein the amount of said glassy coating and the amount of metal contained therein is suitable to provide an oxygen transmission value through said film structure of at most about 5 mL/day-$m^2$-atm.

The present invention further provides a similar structure and process in which the dopant is lithium borate.

DETAILED DESCRIPTION OF THE INVENTION

The barrier films of the present inventions are polymeric substrates such as films, coated directly or indirectly with specially selected glass coatings. The polymeric substrates include any having suitable physical and thermal properties for the particular packaging application at hand. The minimum requirement is that they have sufficient thermal and physical properties to withstand the conditions of application of the glass coating, described in more detail below, and exhibit sufficient adhesion to the class coating. Examples of suitable substrates include those prepared from polyamides, including amorphous and semicrystalline polyamides, polycarbonates, polyethers, polyketones, polyester ethers, and polyesters, which are preferred.

Examples of polyester resins include polyethylene naphthalate and most preferably polyethylene terephthalate ("PET"). Examples of semicrystalline polyamides include polycaprolactam (nylon 6) and condensation polymers of dicarboxylic acids and diamines, such as polyhexamethylene adipamide (nylon 6,6) etc. Examples of amorphous polyamides include hexamethylenediamine isophthalamide, hexamethylenediamine isophthalamide/terephthalamide terpolymer, having iso/terephthalic moiety ratios of 100/0 to 60/40, mixtures of 2,2,4- and 2,4,4-trimethylhexamethylenediamine terephthalamide, copolymers of hexamethylene diamine and 2-methylpentamethylenediame with iso- or terephthalic acids, or mixtures of these acids. Polyamides based on hexamethylenediamine iso/terephthalamide containing high levels of terephthalic acid moiety may also be useful particularly when a second diamine such as 2-methyldiaminopentane is incorporated to produce a processible amorphous polymer. Typically a substrate, especially a film, will have been oriented, optionally followed by heat setting so as to provide dimensional and thermal stability.

It is preferred that the substrate has a high surface smoothness. In particular when the substrate is polyethylene terephthalate it is preferred that the substrate have a smoothness such that the average height of roughness is less than about 50 nanometers, and most preferably less than about 10 nanometers, as measured on a WYKO ™ optical profilometer, Model TOPO-3D from WYKO Co., Tuscon, Ariz. Most ordinary PET films have a relatively large degree of surface roughness because of the presence of various internal anti-block and slip additives which are necessary to improve handling properties. An oriented PET film without such additives will have a very smooth surface but cannot generally be handled, i.e., wound and rewound, without introducing excessive wrinkling. However, a practical film with preferred smoothness can be prepared by selectively treating only one surface with a selected antiblock agent, leaving the other surface untreated and smooth. Application of such an agent to at least one surface of a film is described in U.S. Pat. No. 3,808,027, the disclosure of which is incorporated herein by reference. A preferred commercially available substrate is Mylar ® polyester film, type D, which has a surface roughness of 2-7 nm. It is believed that films with this superior level of smoothness provide better adhesion of the glass coating to the film, leading in certain instances to improved barrier properties and improved stability under retort conditions. It is preferred that the glassy coating be applied to the smooth side of such film.

A layer of doped glass is applied to the substrate. This layer can be applied directly to the substrate, or it can be applied indirectly, i.e., atop one or more intermediate layers which are themselves located on the substrate. One such intermediate layer, for example, can be silicon oxide, which is described in more detail below. The doped glass coating should be thick enough to adequately improve the barrier properties of the substrate, but not so thick as to seriously degrade transparency of the substrate or to result in loss of durability or flexibility of the glass, when the substrate is a film. Typically coatings of about 20 to about 500 nm are suitable, depending on the effectiveness of the particular glass composition. A thickness of about 50 to about 350 nm is preferred, although for some compositions a thickness of about 200 to 400 nm is desirable; for particularly effective compositions, a coating of 50 to 100 nm is quite adequate.

The doped glass coating is based on silicon dioxide. The actual stoichiometry of the glass in this layer may vary from the nominal oxygen-silicon ratio of 2:1 of $SiO_2$, for example, due to reactions which may occur during the vacuum deposition process. The glass coating is generally applied to the substrate in a batch or continuous process by any of a variety of conventional vacuum methods. The portion of the substrate to be coated is positioned either by a continuous process or batch process in a chamber within which a vacuum is drawn. A source of silicon dioxide and dopant metal (in either different sources or comixed in a single source, either as a powder, a metal wire, or vitrified into a silica glass) is placed in the vacuum chamber and vaporized by heating with an electron beam or a resistance or induction heated furnace, or by sputtering or reactive sputtering by an ion beam or a magnetron source, or the like. The silicon dioxide, along with the dopant metal, condenses to form the desired coating. The thickness of the coating is determined by the residence time of the substrate in the chamber, the amount of oxide target present in the chamber relative to the area of the substrate, and/or the energy delivered to the source per unit area of the source. When the resin substrate is in the form of a film, the film may be made inaccessible to the vacuum deposition on one surface thereof so that only the opposite surface receives the vacuum deposited layers. When the resin substrate is in the form of a container, the entire container can be positioned within the vacuum chamber. The surface of the resin substrate facing the source receives the vacuum deposited coatings. The substrate can be repositioned and the coating operations repeated to cover additional surfaces, such as the opposite side, of the substrate.

Sufficient vacuum is drawn within the vacuum chamber that the mean free path of the silicon dioxide and dopant molecules is sufficient to reach and therefore enable deposition of the glassy layer on the resin substrate. The vacuum used in the experiments described in the Examples herein generally falls within the range of about 1 to 100 microtorr (760 torr = 1 atm). One skilled in the art will know how to select the proper vacuum for a given vacuum deposition process, including its conditions of operation.

The dopant can be incorporated into the $SiO_2$ layer either by evaporating a single source of a physical or fused mixture of the dopant and $SiO_2$, or by co-depositing the dopant and the $SiO_2$ from two or more sources simultaneously. In both cases, the dopant can be in a metallic form or in the form of an oxide, silicide, silicate, halide, or carbonate, and the like. In the case of depositing from a single source, the proportion of the dopant present in the deposited $SiO_2$ layer may vary from the composition of the source. Such proportion can be determined for a particular source composition and conditions of vacuum deposition and can be adjusted to the proportion desired by adjustment of the source composition. In case of either deposition method, the composition of the coating can be determined by analysis of atomic absorption using inductively coupled plasma (ICP), which is a conventional analysis procedure. This analysis primarily detects the elemental metal in the $SiO_2$. Therefore, the weight percents of dopant disclosed herein are based on the elemental metal of the metal dopant. Thus decomposition products, e.g. $CO_2$ from carbonates, which do not become part of the $SiO_2$ layer are not included in weight percents of dopant in that layer. The weight percents of dopant disclosed herein refer to the composition of the $SiO_2$ layer unless otherwise indicated. These same weight percents may, however, be present in the source(s) for vacuum deposition (co-deposition), and as previously described, the resultant composition of the $SiO_2$ layer for the vacuum deposition conditions used can then be determined, and the source composition can be adjusted in subsequent runs to obtain the final composition desired. More often, the source composition will be adjusted to provide the barrier properties desired for the multilayer structure rather than analyzing the $SiO_2$ layer for its dopant content.

The silicon dioxide coating of the present invention is "doped," as described above, with a high level of at least one of a select group of metals. The term "doping" is used herein to describe a deposition with silicon dioxide of a relatively high level of metal, typically 0.5 to about 25 weight percent, as measured in the source, or about 0.5 to about 30 weight percent as measured as metal in the glass coating itself. (It is understood that the term "doped" or "doping" previously has been used in the art to refer to lower levels of metal additive, typically well below 1%. This is not what is meant by "doped" in the context of the present invention.)

The oxidation state of the metal as it resides in the coating matrix of silicon dioxide is not necessarily clearly understood or well defined. Thus if an elemental metal is used as the source for the dopant, the deposited metal atoms or particles may interact with the oxygen atoms of the matrix to form a partially or completely oxidized material.

Alternatively, if an oxide of the metal is used as the source, it is not necessarily known nor is it necessarily important whether the metal is deposited into the glassy matrix as the oxide or as the elemental metal. It appears that either the elemental metal or an oxide of the metal or certain other metal compounds, regardless of oxidation state can be suitably used as the source of the dopant metal for the present invention. Such possibilities and equivalents thereof are included within the scope of the present invention when terms such as "metal dopant" or the like are used. The selection of an appropriate source for metal dopant will be within the abilities of one skilled in the art and will be determined by such factors as relative cost and ease of handling. In many cases the metal oxide or especially the elemental metal will be preferred.

Suitable metal dopants for the present invention include antimony, aluminum, chromium, cobalt, copper, indium, iron, lead, manganese, tin, titanium, tungsten, zinc, and zirconium. Preferred metals include chromium, manganese, zinc, and most preferably copper and tin. When one or more of these metals are present, the barrier property of the glass coating and of the structure as a whole is greatly improved. Surprisingly it has been found that many other metals do not show this sort of improvement. Among the metals that are not particularly effective at comparable levels are calcium, vanadium, lithium, nickel, molybdenum, gold, germanium, and selenium. Sulfur is similarly not effective. It is surprising that these elements appear in the same regions of the periodic table with the metals that are effective. The chemical phenomenon that distinguishes between these groups of metals is not understood. It is noted that the metals which form a part of the present invention are generally located to the right of Column II of the Periodic Table, that is, to the right of the alkali metals and the alkaline earth metals.

When a metal dopant from the metals of the present invention is used in the layer of silicon dioxide, the improvement in barrier properties can be dramatic. One customary measurement of barrier properties of a film is its oxygen transmission rate ("OTR", ASTM D-3985-81(1988)) expressed as mL oxygen passage/$m^2$-day-atmosphere. A film of ordinary untreated PET, 23 micrometers thick, typically has an OTR of 75-90; that of a 12 micrometer film is typically 150-180. Addition of a 300 nm coating of $SiO_2$ reduces the OTR somewhat, to about 10-80. Addition of one or more of the metals of the present invention can routinely reduce the OTR to less than 5. In copper, the most preferred case, addition of even 1 percent to the $SiO_2$ (measured in the source) can reduce the OTR to as low as 0.5, while use of 5-10 percent copper can result in values as low as 0.3. Use of tin, which is also preferred, provides values nearly as low.

The effectiveness of the barrier properties depends not only on the type of metal involved but also, of course, on the thickness of the glass layer. The effect of total glass thickness can be factored out by focusing on the oxygen permeation value ("OPV," mL-mm,$M^2$-day-atm), which provides a measure of the inherent barrier properties of the glass. A coating of $SiO_2$ alone exhibits an OPV on the order of 0.1 or higher. The coatings of the present invention exhibit OPV of typically $3 \times 10^{-3}$ or lower, and in the best cases as low as $1 \times 10^{-4}$ or better.

The OTR or OPV of a particular film or composition is not a simple linear function of dopant concentration. For each metal dopant there appears to be a certain minimum concentration required to achieve a significant improvement, a concentration range, varying somewhat with the metal but generally within about 0.5 to about 30 weight percent (calculated as elemental metal in total glass layer), where the invention is effective, and a region of higher metal concentration within which the effectiveness diminishes or the optical transparency of the film is adversely affected.

It has further been found that in one embodiment of the present invention, the appearance and resistance of the coated structure to retort conditions is improved when a thin underlayer of SiO is applied to the substrate. Further details of this embodiment are set forth in copending U.S. application Ser. No. 07/513,354 now U.S. Pat. No. 5,085,904 the disclosure of which is incorporated herein by reference.

In addition to the above described layers, an additional protective layer can be added. Such a layer can be selected from any plastic resin that adheres to the $SiO_2$ layer or that adheres via an intervening adhesive layer. Examples of protective layers include a layer of polyester (adhered to the $SiO_2$ layer via an adhesive), polyamides, acrylonitrile copolymers, polyvinylidene chloride, polyethylene, polypropylene, ethylene vinyl acetate copolymer, ethylene/acrylic or methacrylic acid copolymer and ionomer. The protective layer can be applied to the $SiO_2$ layer by conventional processes such as adhesive or thermal laminating or extrusion coating simultaneous with extrusion of the intervening adhesive, if any. The protective layer can also be provided by solvent or dispersion coating onto the $SiO_2$ layer, using multiple coatings if thickness greater than achievable by single coating is desired. The thickness of the protective layer will generally be about 0.5 to 100 micrometers, preferably 10 to 25 micrometers (0.020 to 0.025 mm).

Films and structures of the present invention are useful as a wide variety of packaging, from rigid to semi-rigid containers to packaging film where barrier properties towards oxygen and other materials are desired. The particular use will dictate the choice and shape of the resin substrate. For packaging films, the resin substrate will be in the form of a film having, for example, a thickness of 10 to 150 micrometers, often 12 to 50 or preferably 15 to 25 micrometers.

EXAMPLES 1-136

Silicon dioxide was mixed with a dopant material and loaded into the hearth (crucible) of an electron beam evaporator of the single crucible bent beam source type as sold by a variety of manufacturers including Denton Vacuum of Cherry Hill, NJ. A thin film was formed from this mixture onto the smoother surface of a 23 micrometer (92 gauge) PET film (Mylar ® type D) by electron beam evaporation from the mixture. The accelerator voltage was continuously adjusted to sweep the beam across the material in the source crucible to give uniform erosion of the crucible's contents. The filament current (and hence the beam current) was adjusted to provide a high deposition rate, resulting in a relatively high background pressure of about $1.3 \times 10^{-2}$ Pa (about $1 \times 10^{-4}$ torr). This pressure was not so high as to cause premature arc-over of the electron beam gun. The thickness of the deposit was monitored by a calibrated oscillating quartz crystal monitor such as manufactured by Veeco Instruments Inc., Plainview, N.Y. The film (unless another grade is reported) had an average (RA) surface roughness of 2-7 nanometers. The coated film's oxygen transmission rate was measured using an "Ox-Tran 1000 TM" oxygen permeation device manufactured by Modern Control Inc. of Minneapolis, Minn. All data in Table I were obtained at 30° C. at 80% relative humidity, using 100% oxygen at 1 atmosphere pressure (about 101 kPa). The results are reported in the Tables as oxygen transmission rate (mL/$m^2$-day-atm). In addition the results are reported as oxygen permeation value (mL-mm/$m^2$-day-atm) by subtracting the (minimal) barrier properties of the uncoated film and dividing the result by the thickness of the glass coating.

The results for the first Examples, Table I, Examples 1-11, illustrate the poor barrier properties of PET film treated with a layer of undoped silicon dioxide.

TABLE I

| Ex.[a] | Dopant | Thickness, nm | OTR | OPV × $10^6$ |
|---|---|---|---|---|
| C1 | none | 325 | 23.6 | 12054 |
| C2 | " | 300 | 84.3 | >100000 |
| C3 | " | 301 | 76.4 | >100000 |
| C4 | " | 303 | 77.1 | >100000 |
| C5 | " | 314 | 7.1 | 2517 |
| C6 | " | 315 | 62.1 | >100000 |
| C7 | " | 323 | 51.6 | 83026 |
| C8 | " | 355 | 10.1 | 4238 |
| C9[b] | " | — | 161.5 | — |
| C10[b] | " | — | 72.4 | — |
| C11[b] | " | — | 28.1 | — |

[a]Examples designated "C" are included for comparative purposes.
[b]PET film having a surface roughness of 26-33 nm and a thickness of 12 micrometers.
— indicates value not measured.

The results in the next series of Examples, Table II, Examples 12-57, illustrate many of the metal dopants which are not a part of the present invention. Most of these dopants do not provide significant improvements in barrier properties in the concentration ranges examined, although a few do show improvement (e.g. $MgF_2$, MgO, BaO, disclosed in U.S. Pat. No. 4,702,963 along with CaO which does not show adequate activity). For reasons which are not fully understood, low levels of lithium borate, $Li_2B_4O_7$, seem to be effective and are thus considered to be included within the scope of the present invention.

TABLE II

| Ex.[a] | Dopant. | % | Thickness, nm | OTR | OPV × $10^6$ |
|---|---|---|---|---|---|
| C12 | Ag | 10 | 301 | 8.5 | 2944 |
| C13 | AgO | 10 | 300 | 5.9 | 1944 |
| C14 | BaO | 10 | 307 | 2.6 | 828 |
| C15 | BaO | 30 | 315 | 7.7 | 2743 |
| C16 | $B_2O_3$ | 3 | 326 | 80.3 | >100000 |
| C17 | $B_2O_3$ | 10 | 213 | 77.2 | >100000 |
| C18 | $B_2O_3$ | 10 | 327 | 83.4 | >100000 |
| C19 | $Ca(BO_2)_2$ | 10 | 290 | 74.7 | >100000 |
| C20 | $Ca(BO_2)_2$ | 10 | 303 | 35.5 | 23832 |
| C21 | $Ca(BO_2)_2$ | 25 | 239 | 82.5 | >100000 |
| C22 | $Ca(BO_2)_2$ | 50 | 230 | 73.2 | >100000 |
| C23 | CaO | 10 | 301 | 6.0 | 1985 |
| C24 | CaO | 30 | 265 | 12.3 | 4042 |
| C25 | $K_2O$ | 10 | 308 | 27.0 | 14319 |
| C26 | Li | 3 | — | 80.6 | — |
| 27 | $Li_2B_4O_7$ | 1 | 307 | 2.5 | 797 |
| 28 | $Li_2B_4O_7$ | 2 | 301 | 2.4 | 756 |
| C29 | $Li_2B_4O_7$ | 7 | 301 | 41.5 | 34897 |
| C30 | LiF | 1 | 301 | 30.1 | 17002 |
| C31 | LiF | 4 | 300 | 50.4 | 68597 |
| C32 | $MgCl_2$ | 2 | 301 | 51.7 | 78306 |
| C33 | $MgCl_2$ | 10 | 246 | 19.0 | 6639 |
| C34 | $MgCl_2$ | 10 | 246 | 23.3 | 8955 |
| C35 | $MgF_2$ | 1 | 303 | 20.6 | 9185 |
| C36 | $MgF_2$ | 2 | 299 | 1.1 | 320 |
| C37 | $MgF_2$ | 5 | 105 | 4.0 | 449 |
| C38 | $MgF_2$ | 5 | 201 | 2.2 | 455 |
| C39 | $MgF_2$ | 5 | 303 | 1.1 | 334 |
| C40 | $MgF_2$ | 10 | 297 | 1.1 | 328 |
| C41 | $MgF_2$ | 10 | 308 | 1.1 | 340 |
| C42 | $MgF_2$ | 15 | 306 | 2.2 | 713 |
| C43 | $MgF_2$ | 30 | — | 10.2 | — |
| C44 | MgO | 5 | 304 | 1.9 | 602 |
| C45 | MgO | 10 | 302 | 5.4 | 1766 |
| C46 | MgO | 35 | 215 | 1.6 | 341 |
| C47 | MgO | 35 | 306 | 1.6 | 486 |
| C48 | $Na_2B_4O_7$ | 4 | 321 | 29.9 | 17889 |
| C49 | $Na_2B_4O_7$ | 10 | — | 57.2 | — |
| C50 | $Na_2B_4O_7$ | 10 | 265 | 66.0 | >100000 |
| C51 | $Na_2SO_4$ | 5 | 302 | 60.2 | >100000 |
| C52 | $Na_2SO_4$ | 20 | 304 | 70.3 | >100000 |
| C53 | Na + Al[a] |  | 301 | 73.1 | >100000 |

TABLE II-continued

| Ex.[a] | Dopant. | % | Thickness, nm | OTR | OPV × $10^6$ |
|---|---|---|---|---|---|
| C54 | Mo | 10 | 302 | 72.7 | >100000 |
| C55 | Ni | 10 | 299 | 55.8 | >100000 |
| C56 | Si | 10 | 304 | 3.3 | 1073 |
| C57 | Si | 20 | 307 | 1.5 | 463 |

[a]A fused glass; exact composition unknown.

The next series of Examples, Table III, Examples 58–67, show certain metal compound dopants ($AlF_3$, $CuCO_3$, $CuF_2$, $Cu_5Si$, and $WO_2$) which are effective only at comparatively higher concentrations in the source, e.g., about 20%. It is believed that these materials evaporate at a slower rate than does $SiO_2$, resulting in lower actual concentrations in the films. Yet it is believed that when a sufficient amount of metal is deposited in the glass coating, the results nevertheless show significant improvement in barrier properties.

TABLE III

| Ex. | Dopant, | % | Thickness, nm | OTR | OPV × $10^6$ |
|---|---|---|---|---|---|
| C58 | $AlF_3$ | 2 | 302 | 19.5 | 8445 |
| 59 | $AlF_3$ | 10 | 313 | 2.9 | 961 |
| C60 | $CuCO_3$—$Cu(OH)_2$ | 5 | 302 | 15.3 | 6038 |
| 61 | $CuCO_3$ | 20 | 300 | 1.6 | 491 |
| C62 | $CuF_2$ | 5 | 273 | 9.8 | 3152 |
| C63 | $Cu_5Si$ | 5 | 308 | 78.9 | >100000 |
| 64 | $Cu_5Si$ | 20 | 302 | 1.9 | 588 |
| 65 | $Cu_5Si$ | 20 | 302 | 0.9 | 275 |
| C66 | $WO_2$ | 5 | 286 | 79.9 | >100000 |
| 67 | $WO_3$ | 20 | 123 | 4.1 | 537 |

The last series of Examples, in Table IV, Examples 68–136, illustrate the results using metal dopants of the present invention. Concentrations of metal within the effective concentration ranges provide marked improvements in barrier properties. (In some of the examples using copper, the metal was added to the source material in the form of a wire; in other examples, as a powder. No consistent differences in the results were observed.)

TABLE IV

| Ex. | Dopant, | % | Thickness, nm | OTR | OPV × $10^6$ |
|---|---|---|---|---|---|
| 68 | Al | 2 | 303 | 1.9 | 595 |
| 69 | Al | 10 | 303 | 1.3 | 403 |
| 70 | Al | 10 | 311 | 1.6 | 494 |
| 71 | Al | 15 | 312 | 4.5 | 1496 |
| C72[a] | Al | 30 | 321 | 14.3 | 5875 |
| 73 | Co | 10 | 214 | 0.9 | 196 |
| 74 | Cr | 10 | 303 | 1.3 | 408 |
| 75 | Cr | 20 | 302 | 1.9 | 603 |
| 76 | Cr | 30 | 300 | 0.7 | 207 |
| 77 | Cr | 30 | 302 | 1.3 | 387 |
| C78 | Cu | 1 | 300 | 8.1 | 2793 |
| C79[a] | Cu | 1 | 300 | 124.0 | >100000 |
| 80 | Cu | 1 | 301 | 0.5 | 160 |
| 81 | Cu | 2 | 26 | 3.7 | 102 |
| 82 | Cu | 2 | 52 | 4.9 | 276 |
| 83 | Cu | 2 | 301 | 0.7 | 198 |
| 84 | Cu | 3 | 303 | 4.1 | 1334 |
| 85[b] | Cu | 5 | — | 0.7 | — |
| C86 | Cu | 5 | 28 | 11.4 | 388 |
| 87 | Cu | 5 | 51 | 2.1 | 109 |
| 88 | Cu | 5 | 100 | 0.9 | 90 |
| 89 | Cu | 5 | 301 | 0.5 | 160 |
| 90 | Cu | 5 | 301 | 1.0 | 308 |
| 91 | Cu | 5 | 303 | 0.3 | 80 |
| 92[c] | Cu | 5 | 305 | 2.6 | 829 |
| 93[d] | Cu | 5 | 300 | 2.5 | 770 |
| 94[e] | Cu | 5 | 295 | 2.2 | 658 |
| C95[f] | Cu | 5 | 300 | 7.6 | 2428 |
| 96[g] | Cu | 5 | 298 | 5.1 | 1712 |
| 97[h] | Cu | 5 | 300 | 0.9 | 271 |

TABLE IV-continued

| Ex. | Dopant. | % | Thickness, nm | OTR | OPV × 10⁶ |
|---|---|---|---|---|---|
| 98[h] | Cu | 5 | 302 | 1.8 | 567 |
| 99[i] | Cu | 5 | 301 | 1.5 | 527 |
| 100 | Cu | 5 | 301 | 0.9 | 289 |
| C101 | Cu | 5 | 303 | 60.3 | >100000 |
| C102 | Cu | 10 | 26 | 7.6 | 225 |
| 103 | Cu | 10 | 28 | 2.9 | 84 |
| 104 | Cu | 10 | 51 | 2.9 | 155 |
| 105 | Cu | 10 | 102 | 3.3 | 360 |
| 106 | Cu | 10 | 117 | 2.1 | 257 |
| 107 | Cu | 10 | 301 | 0.3 | 94 |
| 108 | Cu | 10 | 301 | 0.5 | 155 |
| 109 | Cu | 15 | 100 | 1.3 | 136 |
| 110 | Cu | 20 | 301 | 2.3 | 726 |
| 111 | Cu | 30 | 300 | 0.6 | 188 |
| C112 | Cu,B[k] | 5 | 302 | 74.1 | >100000 |
| 113 | Cu(NO₃)₂ | 5 | 253 | 3.5 | 933 |
| 114 | Fe | 5 | 302 | 1.4 | 421 |
| 115 | Fe | 10 | 304 | 3.6 | 1174 |
| 116 | In | 5 | 302 | 1.6 | 509 |
| 117 | In | 20 | 309 | 1.5 | 476 |
| 118 | Mn | 10 | 302 | 0.6 | 189 |
| 119 | Pb | 10 | 330 | 1.5 | 497 |
| 120 | Pb | 20 | 309 | 1.7 | 526 |
| 121 | Sb | 5 | 190 | 5.8 | 1093 |
| 122 | Sn | 5 | 302 | 1.2 | 358 |
| 123 | Sn | 5 | 304 | 1.1 | 335 |
| 124[j] | Sn | 5 | 130 | 1.6 | 256(est.) |
| 125 | Sn | 10 | 150 | 3.3 | 524 |
| 126 | Sn | 20 | 303 | 1.0 | 296 |
| 127 | Sn | 30 | 54 | 6.2 | 373 |
| C128[a] | Sn | 30 | 54 | 146.8 | >100000 |
| C129[a] | 316 stainless steel[l] | 10 | 305 | 5.3 | 1767 |
| 130 | TiO₂ | 10 | 300 | 3.8 | 1200 |
| 131 | Zn | 10 | 65 | 6.2 | 448 |
| 132 | Zn | 10 | 257 | 1.4 | 375 |
| 133 | Zn | 10 | 296 | 5.9 | 1913 |
| 134 | Zn | 20 | 304 | 2.2 | 688 |
| 135 | ZnO | 10 | 308 | 1.8 | 555 |
| 136 | { Zn / Cu } | { 5 / 2 } | 301 | 3.9 | 1262 |

[a]Borderline example; results subject to scatter.
[b]PET film "Melinex Type 442," surface roughness 10-18 nm. Coating thickness not measured.
[c]PET film having a surface roughness of 10-18 nm and a thickness of 14 micrometers.
[d]PET film having a surface roughness of 26-33 nm and a thickness of 12 micrometers.
[e]PET film having a surface roughness of greater than 26 nm and a thickness of 23 micrometers.
[f]Polyester film having a surface roughness of 41-49 nm and a thickness of 12 micrometers.
[g]Laminate of the coated film to a layer of uncoated 12 micrometer PET, using copolyester adhesive sheet.
[h]Laminate of the coated film to a layer of PET having a coating of heat sealable polyester copolymer, using copolyester adhesive sheet.
[i]Laminate of the coated film to a layer of PET coated with PVDC, using copolyester adhesive sheet.
[j]Substrate film poly(ethylene-2,6-napthalene dicarboxylate with 30 nm undercoating of SiO.
[k]Fused silica glass containing Cu and B
[l]18% Cr, 11% Ni, 2.5% Mo, <0.1% C, remainder Fe.

EXAMPLES 137-175

In the previous Tables the amount of dopant is listed as the amount present in the source in the hearth of the evaporator. The actual amount present in the glass coating was independently measured for some samples by atomic absorption. About 2-2.5 g of the sample is weighed accurately and charred with concentrated sulfuric acid, then dissolved by addition of concentrated nitric acid (aqua regia) and concentrated hydrofluoric acid and heating. The solution is diluted to 100 mL and analyzed by an Applied Research Laboratories 34000 simultaneous inductively coupled plasma analyzer or a Perkin Elmer 6500 (sequential) inductively coupled plasma analyzer. The amounts of the reported elements are calculated assuming that the dopant is the elemental metal and the matrix is SiO₂ (m.w. 60). The results are shown in Table V.

TABLE V

| Ex. | Dopant | Thickness nm | Source % | Coating % |
|---|---|---|---|---|
| C137 | Ag | 303 | 10.0 | 0.1 |
| C138 | B₂O₃ | 300 10.0 | 0.7 | |
| C139 | MgF₂ | 302 | 5.0 | 0.6 |
| C140 | MgF₂ | 301 | 10.0 | 1.0 |
| C141 | Mo | 301 | 10.0 | 13.4 |
| C142 | Na₂B₇O₄ | 302 | 10.0 | {2.1 Na} {1.3 B} |
| C143 | Ni | 300 | 10.0 | 16.3 |
| 144 | Al | 302 | 5.0 | 3.8 |
| 145 | Al | 312 | 10.0 | 4.0 |
| 146 | Al | 303 | 10.0 | <1.8 |
| 147 | Fe | 298 | 5.0 | 7.4 |
| 148 | Fe | 304 | 10.0 | 13.5 |
| 149 | Cr | 301 | 2.0 | 3.2 |
| 150 | Cr | 301 | 5.0 | 8.8 |
| 151 | Cr | 298 | 5.0 | 7.7 |
| 152 | Cr | 304 | 10.0 | 14.6 |
| 153 | Cr | 301 | 10.0 | 14.1 |
| 154 | Cu | 147 | 5.0 | 10.5 |
| 155 | Cu | 299 | 5.0 | 0.0 |

TABLE V-continued

| Ex. | Dopant | Thickness nm | Source % | Coating % |
|---|---|---|---|---|
| 156 | Cu | 300 | 5.0 | 1.5 |
| 157 | Cu | 307 | 5.0 | 8.7 |
| 158 | Cu | 310 | 5.0 | 7.4 |
| 159 | Cu | 152 | 10.0 | 15.8 |
| 160 | Cu | 299 | 10.0 | 8.7 |
| 161 | Cu | 303 | 10.0 | 6.2 |
| 162 | Cu | 305 | 10.0 | 21.2 |
| 163 | Cu | 276 | 10.0 | 17.1 |
| 164 | Cu | 301 | 20.0 | 30.2 |
| 165 | Cu | 153 | 20.0 | 29.8 |
| 166 | Mn | 302 | 10.0 | 12.9 |
| 167 | Sn | 301 | 2.0 | 8.8 |
| 168 | Sn | 152 | 5.0 | 12.2 |
| 169 | Sn | 304 | 5.0 | 24.3 |
| 170 | Sn | 302 | 5.0 | 17.5 |
| 171 | Sn | 301 | 5.0 | 12.0 |
| 172 | Sn | 271 | 5.0 | 8.8 |
| 173 | Sn | 153 | 10.0 | 14.6 |
| 174 | Sn | 306 | 10.0 | 24.7 |
| 175 | Sn | 285 | 10.0 | 26.4 |

The considerable scatter in the analysis of the coating composition is believed to arise from several sources including inaccuracies in the atomic absorption technique and the use of a laboratory evaporation method which uses a powder mixture of the components which may be less reproducible than desired. However correlations can be obtained which indicate actual coating compositions with a calculable uncertainty. The results relating to the metals included in the present invention all indicate a higher concentration of the dopant metal in the coatings than in the source, with the possible exception of aluminum and silver. These trends are believed to be related to the relative vapor pressures of the metals compared with silicon dioxide. In particular the amount of copper or chromium in the glassy coating is about 1.4–1.5 times the amount in the source; the amount of tin in the coating is about 2.4–2.5 times the amount in the source. Metal compound dopants, for example some metal oxides, which may have lower vapor pressures than the elemental metals, may exhibit different correlations from those seen for the elemental metals. This phenomenon would explain the behavior of the examples in Table III, which require higher concentrations in the source to be effective. However, differences in vapor pressure cannot explain the ineffectiveness of such metals as nickel or molybdenum, which do appear in the coatings in amounts comparable to those for e.g. copper.

EXAMPLES 176–209

The Examples in Table VI show the effect of increasing dopant levels on visible light transmission of films prepared according to the procedure of Examples 1–136 using a batch "bell-jar" process. The visible light absorbance (from which transmission is calculated) was measured using a Hewlett-Packard 8452A diode-array UV-vis spectrophotometer, having a bandwidth of 2 nm, wavelength reproducibility of ±0.05 nm, and stability of <0.002 absorbance units. The device measures the entire UV and visible absorbance spectrum simultaneously without scanning. The zero absorbance level was defined using air as the blank. For each film the absorbance spectrum from 360 to 740 nm was measured and stored on disk. The absorbances at 400 and 550 nm are reported. It is observed that percent transmission decreases with increasing dopant level; preferred films are those which retain at least about 70 percent transmission at 550 nm. Iron, chromium, and tin appear to be preferred in minimizing loss of optical transmission. Iron appears particularly suitable in this regard and actually appears to enhance the optical transmission.

TABLE VI

| Ex. | Dopant | % | Thickness (nm) | % Transmission 400 nm | % Transmission 550 nm |
|---|---|---|---|---|---|
| C176 | (no coating) | | | 85.01 | 88.71 |
| C177[a] | (no coating) | | | 69.25 | 77.34 |
| C178 | none | — | 323 | 81.85 | 83.18 |
| C179 | none | | 303 | 75.68 | 83.56 |
| C180 | $MgF_2$ | 5 | 201 | 88.10 | 88.10 |
| 181 | $MgF_2$ | 5 | 306 | 88.98 | 90.19 |
| 182 | $MgF_2$ | 10 | 301 | 86.90 | 92.17 |
| C183[b] | $SF_6$ | 5 | 306 | 86.60 | 87.70 |
| 184 | Al | 5 | 304 | 76.21 | 80.91 |
| 185 | Al | 15 | 312 | 38.90 | 75.86 |
| 186 | Al | 30 | 321 | 1.45 | 28.18 |
| 187 | Cr | 5 | 304 | 84.96 | 88.73 |
| 188 | Cr | 10 | 152 | 82.45 | 82.42 |
| 189 | Cr | 10 | 303 | 85.62 | 90.07 |
| 190 | Cr | 20 | 76 | 81.16 | 83.67 |
| 191 | Cr | 20 | 153 | 70.89 | 78.76 |
| 192 | Cr | 20 | 302 | 12.30 | 31.62 |
| 193 | Cu | 5 | 300 | 59.57 | 71.94 |
| 194 | Cu | 5 | 301 | 73.79 | 81.66 |
| 195 | Cu | 10 | 117 | 64.12 | 72.44 |
| 196 | Cu | 10 | 311 | 51.71 | 71.94 |
| 197 | Cu | 20 | 78 | 84.96 | 88.73 |
| 198 | Cu | 20 | 155 | 50.05 | 61.44 |
| 199 | Cu | 20 | 301 | 25.59 | 39.81 |
| 200 | Cu | 20 | 302 | 53.48 | 65.80 |
| 201 | Fe | 5 | 302 | 87.90 | 89.41 |
| 202 | Fe | 10 | 304 | 82.99 | 89.54 |
| 203 | Mn | 10 | 302 | 78.16 | 83.95 |
| 204 | Pb | 10 | 330 | 26.61 | 41.88 |
| 205 | Sn | 5 | 302 | 85.11 | 88.72 |
| 206 | Sn | 10 | 150 | 82.70 | 85.51 |
| 207 | Sn | 10 | 311 | 84.45 | 85.29 |
| 208 | Sn | 20 | 76 | 86.50 | 90.16 |
| 209 | Sn | 20 | 303 | 25.94 | 36.31 |

[a]Commodity PET film with internal slip additive. 24 micrometers thick.
[b]Coating prepared from lead glass - about 70% Pb.

We claim:
1. A structure having superior barrier properties, comprising:
   (a) a polymeric substrate, and
   (b) a glassy coating of silicon dioxide doped with at least one metal selected from the group consisting of antimony, aluminum, chromium, cobalt, copper, indium, iron, lead, manganese, tin, titanium, tungsten, zinc, and zirconium, said coating and metal dopant contained therein being present in an amount suitable to provide an oxygen transmission value through the coated structure of at most about 5 mL/day-m$^2$-atm.

2. The structure of claim 1 wherein the amount of glassy coating and the amount of metal dopant contained therein are suitable to provide an oxygen transmission value through the coated structure of at most about 1.5 mL/day-m$^2$-atm.

3. The structure of claim 1 wherein the amount of metal dopant is suitable to provide an oxygen permeation value for said glassy coating of at most about 3000×10$^{-6}$ mL-mm/day-m$^2$-atm.

4. The structure of claim 1 wherein the amount of metal dopant is suitable to provide an oxygen permeation value for said glassy ooating of at most about 600×10$^{-6}$ mL-mm/day-m$^2$-atm.

5. The structure of claim 1 wherein the amount of metal dopant is suitable to provide an oxygen permeation value for said glassy coating of at most about $400 \times 10^{-6}$ mL-mm/day-m$^2$-atm.

6. The structure of claim 1 wherein the thickness of the glassy coating is about 20 to about 500 nm.

7. The structure of claim 6 wherein the thickness of the glassy coating is about 50 to about 350 nm.

8. The structure of claim 1 wherein the glassy coating of silicon dioxide is doped with a metal selected from the group consisting of copper, chromium, manganese, tin, and zinc.

9. The structure of claim 8 wherein the metal is copper.

10. The structure of claim 8 wherein the metal is tin.

11. The structure of claim 1 wherein the amount of dopant metal is sufficiently low that the optical density of said glassy coating retains at least about 70% optical transmission at 550 nm.

12. The structure of claim 1 wherein the amount of dopant metal calculated as elemental metal is about 0.5 to about 30 weight percent of the glassy coating.

13. The structure of claim 9 wherein the amount of copper in the glassy coating is about 1 to about 15 weight percent.

14. The structure of claim 10 wherein the amount of tin in the glassy coating is about 3 to about 30 weight percent.

15. The structure of claim 1 wherein the polymeric substrate is a film.

16. A multiple layer structure comprising the structure of claim 15 as at least one layer.

17. The structure of claim 1 wherein the polymeric substrate has a surface smoothness such that the average height of roughness is less than about 50 nanometers.

18. The structure of claim 1 wherein the polymeric substrate has a surface smoothness such that the average height of roughness is less than about 10 nanometers.

19. The structure of claim 15 wherein the substrate film is polyester or polyamide.

20. The structure of claim 19 wherein the substrate film is oriented polyethylene terephthalate.

21. The structure of claim 1 further comprising a plastic resin protective layer.

22. A structure having superior barrier properties, comprising:
 (a) a polymeric substrate, and
 (b) a glassy coating of silicon dioxide doped with lithium borate in an amount suitable to provide an oxygen transmission value through the coated structure of at most about 5 mL/day-m$^2$-atm.

* * * * *